United States Patent [19]

McFadyen

[11] 4,201,946
[45] May 6, 1980

[54] AM-FM DETECTOR CIRCUIT STABILIZED AGAINST FABRICATION AND TEMPERATURE VARIATIONS

[75] Inventor: Robert J. McFadyen, Syracuse, N.Y.

[73] Assignee: General Electric Company, Syracuse, N.Y.

[21] Appl. No.: 972,645

[22] Filed: Dec. 22, 1978

[51] Int. Cl.² .................. H03D 3/22; H03D 5/00
[52] U.S. Cl. ........................... 329/2; 455/143; 455/144; 329/101; 329/103; 329/138; 329/142; 329/147
[58] Field of Search ............... 329/2, 1, 101, 103, 329/135, 137, 138, 142, 147; 325/315–317

[56] References Cited

U.S. PATENT DOCUMENTS

| | | | |
|---|---|---|---|
| 3,936,750 | 2/1976 | Peil et al. ........................ | 325/315 |
| 3,999,138 | 12/1976 | Peil et al. ........................ | 329/2 |
| 4,050,022 | 9/1977 | McFadyen et al. ............. | 325/315 |

Primary Examiner—Siegfried H. Grimm
Attorney, Agent, or Firm—Richard V. Lang; Carl W. Baker; Philip L. Schlamp

[57] ABSTRACT

A detector circuit for detecting AM and FM signals adapted particularly for integrated circuit fabrication which has a circuit configuration that provides highly stable operating characteristics for both AM and FM operation and is responsive to an increased dynamic range of AM signals. The circuit is uniquely designed to exhibit minimal bias and output voltage variations in the presence of unavoidable IC process changes from one circuit to another and ambient temperature changes, by employing an arrangement of circuit components that readily compensate for such changes.

10 Claims, 3 Drawing Figures

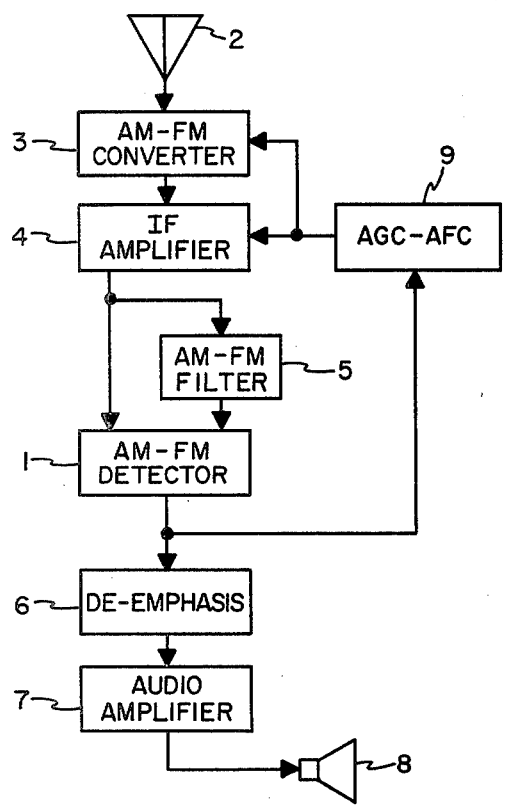
FIG. 1
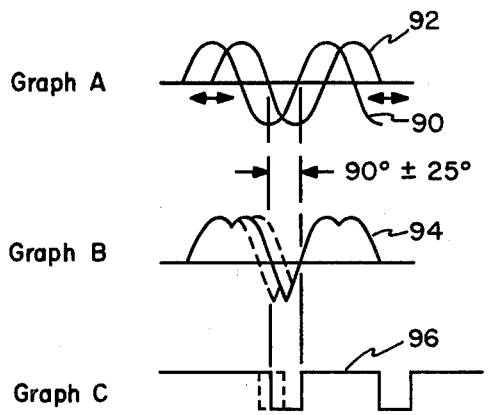
FIG. 3
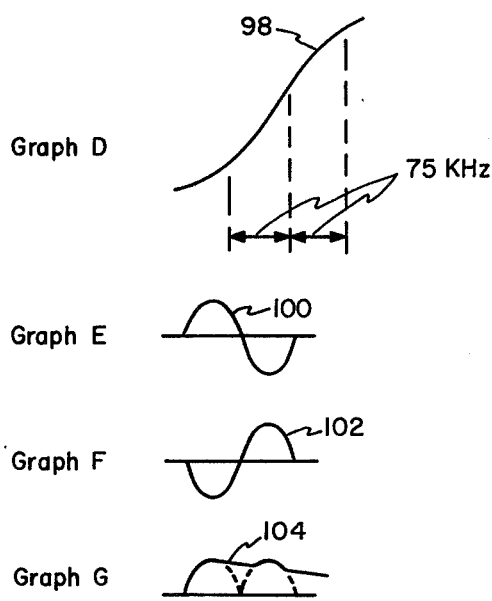

AM-FM DETECTOR CIRCUIT STABILIZED AGAINST FABRICATION AND TEMPERATURE VARIATIONS

BACKGROUND OF THE INVENTION

The invention pertains to detection circuits and more specifically to integrated circuits that detect both AM and FM signals through sharing of circuit components for the two operations.

In particular, the invention provides improvement over the circuit disclosed in U.S. Pat. No. 3,999,138, entilted "Detector for AM-FM Signals," William Peil and Robert J. McFadyen, issued Dec. 21, 1976, in respect to bias and output voltage variations in AM and FM operation and dynamic range of the AM signal. While the noted patent discloses an AM-FM detector circuit of highly satisfactory operation well suitable for integrated circuit (IC) fabrication, unavoidable discrepancies in the processing of the IC's create differences in the electrical properties of the IC's active and passive components from one circuit to another, in particular the result of differences relating to geometry of the semiconductor components. These discrepancies, however slight, tend to produce bias and output voltage variations which reduce the percentage of circuits of the total number fabricated that have specifications falling within acceptable limits, commonly referred to as yield. In addition, in operation the patented circuit may exhibit additional bias and output signal variations with changes in ambient temperature. While these temperature related instabilities can be compensated for in FM operation by added voltage compensating circuitry, such compensation is not readily achieved in AM operation. This results in the output AGC voltage having a tendency to drift with temperature change, which requires a tightening of the specifications and thereby acts to further reduce the yield.

SUMMARY OF THE INVENTION

It is accordingly an object of the invention to provide a novel AM-FM detector circuit of improved circuit configuration which achieves a highly stable operation for both AM and FM modes.

It is another object of the invention to provide a novel AM-FM detector circuit that is adapted for IC fabrication which can be produced with improved yields and therefore at lower end costs.

It is a further object of the invention to provide a novel AM-FM detector circuit as referred to above wherein bias and output voltage variations due to unavoidable IC process changes are significantly reduced.

It is yet another object of the invention to provide a novel AM-FM detector circuit as referred to above wherein bias and output voltage variations due to changes in ambient temperature are significantly reduced.

It is yet a further object of the invention to provide a novel AM-FM detector circuit of improved circuit configuration which for AM operation is capable of responding to AM signals over an increased dynamic range.

These and additional objects of the present invention are accomplished by an AM-FM detector circuit that for FM operation responds to a source of frequency modulated signals of a first predetermined center frequency, typically 10.7 MHz, including first phase shift means for producing a substantially linear change of phase with frequency, the phase shift at the center frequency normally being approximately 90°, and for AM operation responds to a source of amplitude modulated signals of a second predetermined center frequency, typically 455 KHz, including second phase shift means producing a phase shift of approximately 180°, said detector circuit comprising a pair of unidirectionally conducting semiconductor means, in one preferable embodiment being in the form of a differentially connected emitter follower pair of transistors with their collectors coupled to dc voltage means and their emitters returned to ground through a load impedance which during frequency modulation detection comprises a first constant current source, an inphase signal coupled to the base of one transistor and a phase shifted signal coupled to the base of the other transistor, the output waveform of the emitter follower transistors representing the greater or predominant one of the input waveforms so that there is produced at the emitters during FM operation a bipolar voltage having zero crossing intervals proportional to the frequency modulation and during AM operation a peak detected voltage, said detector circuit further comprising for FM operation a zero crossing detector which receives said bipolar voltage to form a succession of substantially rectangular, constant amplitude pulses having a duration substantially equal to said zero crossing intervals, said pulses being amplified and converted to a time averaged waveform whose amplitude is proportional to the frequency deviation of the original IF signal by an FM output amplifier network, said detector circuit further comprising for AM operation an AM amplifier network which receives the peak detected waveform for providing a first stage preamplification of said waveform, the output of said amplifier network being coupled to an AM output amplifier network for providing a second stage preamplification of the detected waveform.

In accordance with one aspect of the present invention said zero crossing detector, AM amplifier network and a single output amplifier network, which serves for both AM and FM detection, each have a balanced circuit configuration for generating an output current comprising a pair of transistor components of matching current conduction properties so that any change in properties of one transistor component, as may be due to IC process variations or ambient temperature variations, is substantially compensated by a corresponding change in properties of the other transistor component, whereby the detector output signal is highly stabilized and substantially invariant in the presence of such process and temperature variations.

In accordance with another, more specific aspect of the present invention the zero crossing detector generates a current output signal that is substantially invariant in the presence of IC process variations and ambient temperature changes, comprising a pair of transistors, their first output electrodes being joined and coupled to a second constant current source, the second output electrode of the first transistor being coupled to the input electrode of the second transistor to provide a regenerative feedback path and through a diode to bias voltage means to which the bases of said emitter follower transistors are also coupled, so that for a condition of no received signal, current in each of said emitter follower transistors is substantially equal to current in said second transistor and the ratio of currents in said first and second transistors is determined by said first and second constant current sources, said bipolar voltage being applied to the intput electrode of the first transistor and the current output signal of said zero crossing detector being derived from the second output electrode of the second transistor which is coupled to the input of the output amplifier network so as to receive its total current from said network.

In accordance with a further more specific aspect of the invention said first preamplification stage generates a current output signal that is substantially invariant in the presence of IC process variations and ambient temperature changes, comprising a linear differential pair of third and fourth transistors, the first output electrodes of which are resistively coupled together and to a third constant current source, the second output electrode of the third transistor being coupled to said dc voltage means and said peak detected voltage being applied to its input electrode, the current output signal of said preamplification stage being derived from the second output electrode of the fourth transistor which is coupled to the input of said output amplifier network so as to receive its total current from said network, and its input electrode being coupled to current bias means for supplying bias current which establishes equal currents in said differential pair when no modulated signal is present at the input.

In accordance with another, more specific aspect of the invention the output amplifier network generates a current signal that is substantially invariant in the presence of IC process variations and ambient temperature changes, comprising a pair of fifth and sixth transistors serving as current multiplier of the zero crossing detector and first preamplification stage outputs and to also provide integration of the zero crossing detector output, the input electrodes of said current multiplier pair being coupled together and to a bias current path, their first output electrodes being resistively coupled to said dc voltage means, the second output electrode of the fifth transistor coupled to the output of the zero crossing detector and to the output of said first preamplification stage, and the second output electrode of the sixth transistor providing the amplified current output signal.

The first, second and third current sources are comprised of transistors having their emitters coupled through current determining resistors to a swtichable ground, their collectors coupled to various parts of the circuit for supplying current thereto and their bases coupled to a voltage reference point. In accordance with yet another aspect of the invention, said voltage reference point is established along the serial connection of a resistance and a diode coupled between the output of a regulated dc voltage and ground, said diode having a temperature coefficient matching the temperature coefficient of the base to emitter junctions of the current source transistors so as to provide a temperature stable reference voltage for said transistors.

In accordance with yet a further aspect of the invention, said dc voltage means to which the collectors of said emitter follower transistors are referenced has a value substantially greater than that of said bias voltage means to which the bases of said emitter follower transistors are referenced so as to provide a relatively increased dynamic range for AM signals.

BRIEF DESCRIPTION OF THE DRAWINGS

While the specification concludes with the claims which particularly point out and distinctly claim that subject matter which is regarded as inventive, it is believed the invention will be more clearly understood when considering the following detailed description taken in connection with the accompanying figures of the drawings, in which:

FIG. 1 is a block diagram of a superheterodyne radio receiver circuit embodying the inventive AM-FM detector circuit;

FIG. 3 is a series of graphs employed in the description of the circuit of FIG. 2.

DESCRIPTION OF A PREFERRED EMBODIMENT

Figure 2:
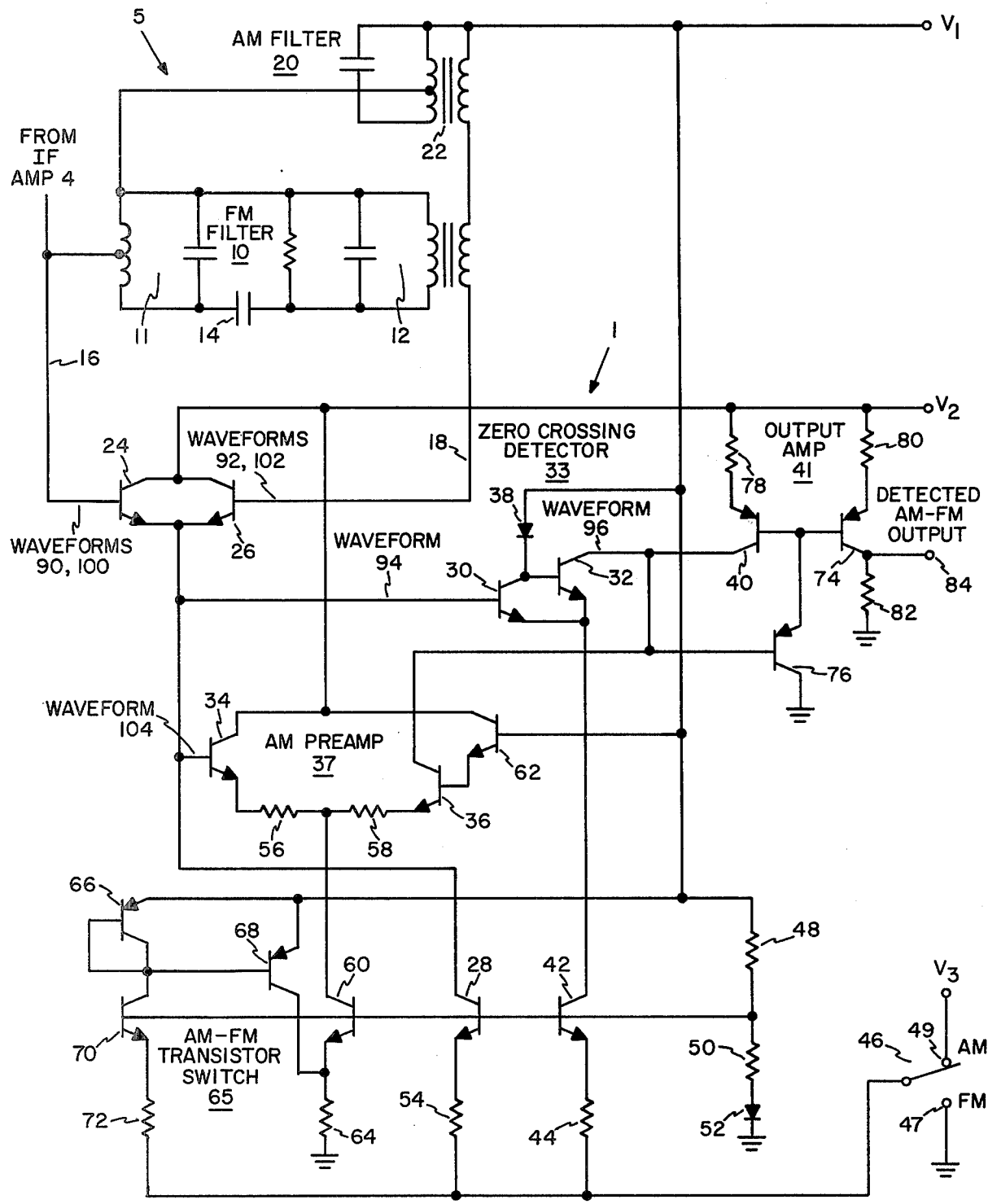
FIG. 2 is a schematic circuit diagram of an AM-FM detector circuit, in accordance with the invention.

With reference to FIG. 1, there is illustrated the inventive detector circuit 1 for detecting AM and FM signals as embodied in a typical superheterodyne radio receiver circuit, the components of which are presented in block form. An antenna means 2 receives AM and FM signals at the RF frequency and couples them to an AM-FM converter 3 for converting the signal to the IF frequency for AM or FM, depending upon the selected mode of operation. The IF signal, having a center frequency nominally of 455 KHz for AM and 10.7 MHz for FM, is coupled to an IF amplifier 4 which provides adjacent signal separation and functions to amplify both IF frequency bands. AM-FM converter 3 and IF amplifier 4 may be known components such as disclosed in U.S. Pat. No. 3,936,750, entitled "AM-FM Receiver Having Improved Bias Supply Circuit," William Peil and Robert J. McFadyen, issued Feb. 3, 1976.

The output of the IF amplifier is coupled to the input of an AM-FM filter network 5, the AM section of which serves to shift the phase of the incoming amplitude modulated IF signal by 180°. The FM section of the filter produces a substantially linear change of phase as a function of frequency of the incoming frequency modulated IF signal, the phase shift at the center frequency being about 90°. The output of the IF amplifier 4 is coupled as an inphase input signal to the AM-FM detector circuit 1, and the output of the AM-FM filter 5 is coupled as a phase shifted input signal to the detector circuit. The detector circuit, which will be described in detail when considering the schematic circuit diagram illustrated in FIG. 2, operates to automatically detect either the AM or FM signal. The circuit is particularly suited to IC fabrication for providing improved yields through significantly reduced bias and output voltage variations in the presence of unavoidable IC process and ambient temperature changes, and also provides extended dynamic range of AM signal response. The detector signal at the output of the detector 1 is coupled to a de-emphasis network 6 and thence to an audio amplifier 7 and speaker 8. The detected signal is also coupled through an automatic gain control-automatic frequency control (AGC-AFC) network 9 to AM-FM converter 3 and IF amplifier 4 for controlling the operation of these components. The de-emphasis and audio amplifier networks may be of conventional circuitry, and the AGC-AFC network may be of known circuitry such as disclosed in U.S. Pat. No. 3,936,750.

As shown in FIG. 2, the FM filter section 10 of filter network 5 includes a first parallel resonant tank circuit 11 at the input and a second parallel resonant tank circuit 12 at the output, capacitively coupled by a capacitor 14 to produce the requisite 90° phase shift at the resonant frequency of 10.7 MHz. The AM and FM output from IF amplifier 4 is connected to a conductor 16 and to a tap on the inductor of the input tank circuit, the output of the FM filter section being transformer coupled to a conductor 18. The AM filter section 20 includes a transformer 22 having a tuned primary winding with a tapped connection from filter section 10 and an untuned secondary winding providing a phase inverting output connection to conductor 18. The filter network sections 10 and 20 are referenced to a first regulated dc voltage supply $V_1$, of for example +3 volts with the tapped portions of the FM and AM input windings serially connected between $V_1$ and conductor 16 and the output windings serially connected between $V_1$ and conductor 18. The filter sections 10 and 20 provide phase shift functions required for the described detection process, as well as additional channel separation.

Conductor 16 connects the output of the IF amplifier as an inphase input signal to the AM-FM detector circuit 1, and conductor 18 connects the outputs of the AM and FM filter sections as a phase shifted input signal to the AM-FM detector circuit. The detector circuit 1 has at its input a differentially connected emitter follower pair of NPN transistors 24 and 26 employed in both AM and FM signal detection. The inphase IF signal is applied to the base of transistor 24, and the phase shifted signal is applied to the base of transistor 26. The collectors of these transistors are joined and connected to a second regulated dc voltage supply $V_2$ which is of substantially greater voltage than $V_1$, for reasons to be considered when discussing the increased dynamic range for AM signals provided by the present circuit. $V_2$ is for example +6 volts. The emitters are joined and connected to the collector of a first current source comprising NPN transistor 28, to the base of an NPN transistor 30 which with NPN transistor 32 comprise a zero crossing detector 33 that is operative during FM detection, and to the base of an NPN transistor 34 which with NPN transistor 36 comprise a linear differential amplifier 37 for providing a first stage preamplification of the AM signal.

The zero crossing detector transistor 30 has its collector electrode connected through a diode 38, poled for forward conduction, to $V_1$ and to the base of transistor 32, the collector of which is coupled to the collector of PNP transistor 40 of an output amplifier network 41. The emitters of transistors 30 and 32 are connected to the collector of a second current source comprising NPN transistor 42. The collector to base connection between transistors 30 and 32 completes a regenerative feedback path. The emitter of transistor 42 is connected through a current determining resistor 44 to a mode setting switch 46 having one fixed contact 47 at ground for FM operation and another fixed contact 49 at a dc voltage $V_3$, for example +1.2 volts, for AM operation. The base of transistor 42 is connected to a temperature stable reference voltage point provided by a network including a pair of resistors 48 and 50 and a forward poled, temperature compensating diode 52, on side of the resistors connected to the regulated dc voltage supply $V_1$ and the other side connected through diode 52 to ground. The reference voltage point is established at the junction of resistors 48 and 50. Constant current source transistor 28 has its emitter connected through a current determining resistor 54 to switch 46 and its base connected to the junction of resistors 48 and 50.

The zero crossing detector 33 generates output current pulses with a duty cycle as a function of FM signal modulation. Transistors 30 and 32 have current conduction properties closely matched to each other and to those of emitter pair transistors 24 and 26, which in IC fabrication is done through precise control of the base-emitter junction geometry of the devices. In the present circuit the transistors are all of minimum junction geometry, except as otherwise noted, whereby transistor current is related by a given function to base-emitter voltage. Minimum junction geometry, or minimum geometry, should be understood to mean the minimum area assigned to the transistor junctions, for a given IC process, in order to provide requisite small signal properties. As will be more fully described, by setting the currents in current source transistors 28 and 42 through resistors 54 and 44, respectively, which currents are made temperature stable, and by controlling device geometry, the current ratio between transistors 30 and 32 can be properly established for providing a symmetrical S curve at the detector output, which represents an average value of output current that does not change from the no IF signal to the unmodulated signal case. The balanced circuit configuration of the zero crossing detector network further provides that the current ratio between transistors 30 and 32 remains constant and the generated output current accurately reflects the FM signal modulation, in the presence of any changes in absolute value of current that may occur due to IC process variations or ambient temperature changes.

With respect to linear differential amplifier 37, its circuit configuration provides the generation of an output current that accurately reflects the AM signal modulation independently of IC process variations and ambient temperature changes. Transistors 34 and 36 have matching current conduction properties and are in a balanced circuit configuration having their emitters coupled through the series connection of resistors 56 and 58, the junction of which is coupled to the collector of a third current source comprising NPN transistor 60. The collector of transistor 34 is connected to $V_2$ and to the collector of a bias current NPN transistor 62, the base of which is connected to $V_1$ and the emitter to the base of transistor 36. The collector of transistor 36 is connected to the collector of transistor 40 of output network 41. Transistor 62 has a base-emitter junction area twice that of transistors 24 and 26 so as to provide equal current conduction in transistors 34 and 36 in the absence of IF signal. The emitter of transistor 60 is connected through current determining resistor 64 to ground, and the base is connected to the voltage reference point at the junction of resistors 48 and 50. The emitter of transistor 60 is also connected to an AM-FM transistor switch arrangement 65 comprising PNP transistors 66, 68 and NPN 70, transistor 68 having a twice minimum junction geometry. Transistor 66 is connected as a diode with the emitters of transistors 66 and 68 connected to $V_1$, the base of transistor 66 connected to its collector, to the base of transistor 68 and to the collector of transistor 70. The collector of transistor 68 is connected to the emitter of transistor 60, the emitter of transistor 70 connected through a resistor 72 to switch 46 and the base of transistor 70 connected to the junction of resistors 48 and 50.

The output amplifier network 41 comprises a balanced configuration of transistor 40 and a current multiplier PNP transistor 74, having matching current conduction properties, and a current isolating PNP transistor 76. Transistor 74 has a base-emitter junction area twice that of transistor 40 for providing a current multiplication of two of the output current. The emitters of transistors 40 and 74 are connected through resistors 78 and 80, respectively, to $V_2$. The bases of these transistors are joined and connected to the emitter of transistor 76, the collector of which is coupled to ground and the base of the collector of transistor 40. The base to emitter capacitance of transistor 74 and the integrative effects associated with the drift time required for carries to reach the collector provide integration of the FM current, and to a small extent of the AM current, the output current being taken from the collector of transistor 74 which is connected through an output resistor 82 to ground and to output terminal 84 of the detector circuit from which the detected AM and FM signals are derived.

In one exemplary embodiment of the AM-FM detector circuit of FIG. 2, the following circuit components and values were employed which are given principally for the purpose of illustration and are not intended to be limiting of the claimed invention:

| Trans- | 24, 26, 28, 30, 32, | Minimum Geometry NPN |
|---|---|---|
| istors | 34, 36, 42, 60, 70 | Minimum Geometry |
| | 40, 66 | Lateral PNP |
| | | Two Times |
| | 68, 74; 62 | Minimum Geometry |
| | | Lateral PNP; NPN |
| | 76 | Minimum Geometry |
| | | Substrate PNP |
| Diodes | 38, 52 | Minimum Geometry |
| | | NPN Type |
| Resistors | 56, 58 | 3 Kohms |
| | 78 | 1200 ohms |
| | 80 | 600 ohms |
| | 82 | 7.5 Kohms |
| | 48 | 6 Kohms |
| | 50 | 1 Kohm |
| | 44 | 870 ohms |
| | 54 | 1.3 Kohms |
| | 64 | 1.35 Kohms |
| | 72 | 930 ohms |
| Voltage | $V_1$ | 3 volts dc |
| Source | $V_2$ | 6 volts dc |
| | $V_3$ | 1.2 volts dc |

Referring to the operation of the detector circuit of FIG. 2, the basic detection operation is the same as in U.S. Pat. No. 3,999,138 and is fully described therein. In this discussion primary emphasis will be placed on the operation insofar as the present invention is concerned. During FM signal detection the mode select switch 46 is at ground which causes first and second current source transistors 28 and 42 to conduct since the reference voltage at the junction of resistors 48 and 50 is at some positive value determined by $V_1$ and the voltage drops across resistors 48 and 50 and diode 52. In addition, transistors 66, 68 and 70 conduct which develops a voltage across resistor 64 that prevents transistor 60 from conducting. Accordingly, the differential amplifier 37 is made inactive. Conduction of the current source transistors 28 and 42 make the zero crossing detector active and determines the currents flowing in it and in the emitter follower pair of transistors 24 and 26. The inphase FM signal coupled to the base of transistor 24, having an input waveform shown by curve 90 in Graph A of FIG. 3, and the phase shifted FM signal coupled to the base of transistor 26, having an input waveform shown by curve 92 in Graph A, cause these transistors to be conductive in accordance with the greater or predominant one of the input waveforms to provide an output waveform as shown by curve 94 in Graph B. The output waveform is a voltage appearing at the common emitters of transistors 24 and 26 having variable width and variable amplitude positive and negative going portions. Significantly, the width or duration of the negative going portions are proportional to the instantaneous frequency deviation. The negative going portions are approximately 90° wide at zero frequency deviation, corresponding to a 90° phase displacement of the two input signals, varying between 65° to 70° for maximum negative frequency deviation and 110° to 115° for minimum positive frequency deviation. As a result of the regenerative feedback path between transistors 30 and 32, the zero crossing detector 33 provides high gain at low signal levels and a limiting action before normal signal levels are reached for converting the negative going portions of waveform 94 into corresponding variable width rectangular pulses of current, such as shown by waveform 96 in Graph C, having a width or duty cycle also proportional to the instantaneous frequency deviation and an amplitude that is constant for avoiding undesirable harmonic distortion in the detected audio signal.

Current conduction in the transistors of the zero crossing detector for a condition of no IF signal is established by the first and second constant current sources of transistors 28 and 42, respectively, and the application of the same bias voltage $V_1$ to the bases of transistors 24 and 26 and to the anode of diode 38. The sum of the base-emitter voltage drops of transistors 26 and 30 must equal the sum of the voltage drops across diode 38 and the base emitter of transistor 32. Since the current flowing in diode 38 must substantially equal the current in transistor 30, by making the junction area of diode 38 and the base-emitter junction areas of transistors 24, 26, 30 and 32 equal, the voltage drop across diode 38 must equal the base-emitter voltage drop of transistor 30. Thus, the base-emitter drops of transistors 26 and 32 must be equal and the currents flowing in these transistors must be equal. By setting the currents in the first and second current source transistors 28 and 42 to some prescribed value, a desired current ratio between the current in transistors 30 and 32 can be readily established for generating an average output current in the network 41 that does not change between the no IF signal and unmodulated signal case and therefore provides a symmetrical S curve at the output of the detector, shown by curve 98 in Graph D. In the exemplary circuit under consideration, the currents in the first and second current sources were set at approximately 0.4I and 0.6I, respectively, with 0.2I current in each of transistors 24 and 26, 0.4I current in transistor 30 and 0.2I current in transistor 32.

The currents in constant current source transistors 28 and 42 are temperature stable to a high degree due to the coupling of their bases to the junction of resistors 48 and 50 of the temperature stable voltage reference network. The voltage at this point is derived from a regulated voltage source $V_1$. Any change in voltage due to change in ambient temperatures across the base-emitter junctions of the current source transistors, which have a negative temperature coefficient, is compensated by a matching negative temperature coefficient of diode 52. Any change in resistance due to change in embient temperature of the current source emitter resistors, which have a positive temperature coeficient, is also substantially compensated by a similar resistance change in the output resistance. While small changes in absolute current can be tolerated, faithful, distortion free detected output signals depend primarily on the proper ratio of the currents in transistors 30 and 32. This ratio once established by the current sources and the precise control of device geometry in the fabrication of the circuit, device geometry being an IC property that can be controlled to a high degree of accuracy for a given IC, will remain substantially constant since any variation in device properties of one of the transistors 30 or 32 in its fabrication or in its operation due to ambient temperature change will be compensated by equal variation in device properties of the other transistor. A similar compensation in device properties is effective for transistors 40 and 74 of the output network 41 and for transistors 34 and 36 of the differential amplifier 37.

For the condition of zero signal modulation a positive polarity signal present at the base of either transistor 24 or 26 will correspondingly increase the voltage at the common emitter above the no IF signal voltage level. Accordingly, for purposes of illustration, it may be assumed that the base of transistor 30 will respond to a positive going voltage for ¾ cycle of the IF and to a negative going voltage for ¼ cycle. Since the zero crossing detector exhibits a high gain due to the regenerative feedback connection between the collector of transistor 30 and the base of transistor 32, during said ¾ cycle transistor 30 rapidly increases its conduction to become fully conductive in the limiting condition and transistor 32 rapidly decreases its conduction to become nonconductive in the limiting condition. Conversely, during said ¼ cycle transistor 30 rapidly becomes nonconductive and transistor 32 fully conductive. Integrative effects contributed by the output network 41, as well as the de-emphasis network 6, provide an average output current value for the zero signal modulation that is equal to that for no IF signal. In response to an FM signal modulation the duty cycle operation of the transistors 30 and 32 and therefore the average output current value is varied as a function of the modulation.

The output current of the zero crossing detector which is the current in transistor 32, flows substantially through transistor 40 of network 41. For this consideration, the additional base current of transistor 76 is negligible. By virtue of the current multiplication provided by transistors 40 and 74, an amplified FM detected output current flows into the load resistance 82. The multiplication factor is made extremely precise by controlling the base-emitter junction geometry of transistor 74 in relation to that of transistor 40 and by proportioning their emitter resistors, in this example the junction area of transistor 74 being twice that of transistor 40 and the value of resistor 80 being one half of that of resistor 78 to provide a current multiplication of two. Transistor 76 serves to effectively buffer the output current from the zero crossing detector by reducing that portion of the transistor 74 base current flowing to the previous stage by the current gain factor of transistor 76, and also to provide the enabling collector voltage for transistors 32 and 36. The balanced circuit configuration of the output network assures no significant change in output current resulting from IC process variations or ambient temperature changes. Thus, there is provided from the output of network 41 a more faithful, distortion reduced, temperature stable FM detected output signals and correspondingly accurate AFC signals.

During Am signal detection the mode select switch 46 is at $V_3$ which is sufficient to cause transistors 28, 42, 66, 68 and 70 to stop conduction and third current source transistor 60 to conduct. This makes zero crossing detector 33 inactive and differential amplifier 37 active. The inphase AM signal coupled to the base of transistor 24, having an input waveform shown by curve 100 in Graph E, and the phase shifted signal coupled to the base of transistor 26, having an input waveform shown by curve 102 in Graph F, are full wave rectified and formed into a peak detected output voltage at the common emitters through integration provided by the total capacitance at the base of transistor 34. The peak detected waveform is shown by curve 104. The bases of transistors 24 and 26 are dc coupled to $V_1$ and the base of transistor 62, which has a base-emitter junction area twice that of each of transistors 24 and 26, is also coupled to $V_1$. Thus, for the condition of no IF signal, equal bias currents are supplied to transistors 34 and 36 for providing equal conduction therein, each transistor conducting one half of the current of constant current source transistor 60. In response to an AM signal applied to transistors 24 and 26, the voltage at the base of transistor 34 increases accordingly to increase conduction in this transistor and reduce conduction in transistor 36 proportional to the amplitude of the signal modulation. The output current of the differential amplifier, which is the current in transistor 36, flows substantially through transistor 40 of output network 41. Network 41 provides current multiplication of the detected AM signal in similar manner described with respect to the FM signal detection operation so as to generate an amplified AM detected output current that flows into load resistance 82.

The current is constant current source transistor 60 is highly temperature stable due to the coupling of its base to the junction of resistors 48 and 50 of the temperature stable network, as previously discussed. Furthermore, as a result of the generation of an output current by the symmetrical circuit arrangement of the differential amplifier transistor 34 and 36, any change in device properties in one of the transistors that may occur due to IC process variations will be compensated by a comparable change in properties of the other transistor so as to always generate an output current that accurately reflects the AM signal modulation. In addition to providing more faithful, distortion reduced AM detected output signals, there is provided more accurate AGC signals which are highly temperature stable.

Through connection of the bases of emitter follower transistors 24 and 26 to bias voltage $V_1$ and the common collector to voltage $V_2$, where $V_2$ is substantially greater than $V_1$, typically two times greater, in combination with the resistive coupling between the emitters of the differential amplifiers 34 and 36, there is provided a relatively wide dynamic range of the AM signal response. The present circuit allows detection of signals up to 2 volts peak to peak. The overall effect of increasing the dynamic range is to reduce signal distortion over the full AGC range.

While the invention has been described with respect to a specific embodiment for the purpose of clear and complete disclosure, the appended claims are not to be thus limited but are to be construed as embodying all modifications and alternative constructions that may occur to one skilled in the art which fairly fall within the full scope of the invention.

What I claim as new and desire to secure as Letters Patent of the United States is:

1. An AM-FM detector circuit exhibiting highly stable operating characteristics compensated for fabrication process and ambient temperature variations, said circuit being selectively responsive to frequency modulated signals of a first center frequency or amplitude modulated signals of a second center frequency, comprising:

(a) a differentially connected emitter follower pair of transistors of matching current conduction properties, the collectors of which are adapted to be coupled to dc voltage means, the emitters of which are joined and coupled to a switchable load impedance and the bases of which are adapted to receive said frequency modulated signals in a quadrature phase relationship at said first center frequency for a condition of zero signal modulation and are adapted to receive said amplitude modulated signals in an inverse phase relationship at said second center frequency, for producing at said emitters during frequency modulation detection a bipolar voltage having zero crossing widths proportional to the frequency modulation and for producing at said emitters during amplitude modulation detection a detected voltage resulting from full wave rectification of the amplitude modulated signals, (b) zero crossing detector means operable during frequency modulation detection and responsive to said bipolar voltage at said emitters for generating current pulses of relatively constant amplitude and of pulse widths corresponding to said zero crossing widths, (c) differential amplifier means operable during amplitude modulation detection and responsive to said detected voltage at said emitters for providing linear amplification of said voltage by generating a corresponding amplified current, and (d) output means including a transistor current amplifier responsive during frequency modulation detection to the current pulses generated by said zero crossing detector means for integrating said pulses and providing a first amplified output current having a time averaged amplitude proportional to the modulation of said frequency modulated signals, and responsive during amplitude modulation detection to the current generated by said differential amplifier means for providing a second amplified output current having an amplitude proportional to the modulation of said amplitude modulated signals.

2. An AM-FM detector circuit as in claim 1 wherein said zero crossing detector means, differential amplifier means and output means each comprise a pair of transistor components of matching current conduction properties connected in a balanced circuit configuration so that any change in properties of one transistor component due to fabrication process variation or ambient temperature variation will be compensated by a corresponding change in properties of the other transistor component, whereby said circuit exhibits minimal output signal variations.

3. An AM-FM detector circuit as in claim 2 wherein during frequency modulation detection said load impedance includes a first constant current source and the transistor component pair of said zero crossing detector means comprises a first and second transistor having their first output electrodes joined and coupled to a second constant current source, said emitters coupled to the input electrode of said first transistor and said current pulses derived from the second output electrode of said second transistor, the second output electrode of said first transistor coupled to a diode which is adapted to be coupled to bias voltage means for establishing a current path through which substantially all of the diode current flows and further coupled to the input electrode of said second transistor to provide a regenerative feedback path through which the small remaining diode current flows, the bases of said emitter follower transistors adapted to be coupled to said bias voltage means so that for a condition of no received signal, current in each of said emitter follower transistors is substantially equal to current in said second transistor and the ratio of currents in said first and second transistors is determined by said first and second constant current sources.

4. An AM-FM detector circuit as in claim 3 wherein during amplitude modulation detection said load impedance includes said differential amplifier means the transistor component pair of which comprises third and fourth transistors having their first output electrodes resistively coupled together and to a third constant current source, the second output electrode of said third transistor adapted to be coupled to said dc voltage means and said emitters coupled to the input electrode of said third transistor, the current output signal of said differential amplifier derived from the second output electrode of said fourth transistor, and the input electrode of said fourth transistor coupled to bias current mewns for supplying bias current which provides equal currents in said third and fourth transistors for a condition of no received signal.

5. An AM-FM detector circuit as in claim 4 wherein the transistor component pair of said output means comprises a fifth and sixth transistor the first output, electrodes of which are coupled to first and second resistors, respectively, which are adapted to be coupled to said dc voltage means, the input electrodes of said fifth and sixth transistors coupled together and to a bias current path for providing a bias voltage to said second and fourth transistors, the second output electrode of said fifth transistor coupled to the second output electrode of said second transistor for receiving said current pulses from the output of said zero crossing detector and coupled to the second output electrode of said fourth transistor for receiving the output current of said differential amplifier means, said first and second resistors and the current conduction properties of said fifth and sixth transistors being proportioned so as to provide amplification of the applied current signals, and the second output electrode of said sixth transistor providing said first and second amplified output currents.

6. An AM-FM detector circuit as in claim 5 wherein said dc voltage means supplies a voltage substantially greater than that of said bias voltage means for providing a relatively wide dynamic range of amplitude modulated signals to which said emitter follower transistors respond during amplitude modulation detection.

7. An AM-FM detector circuit as in claim 6 wherein said constant current sources each include a transistor having its emitter coupled to a current determining resistance and its collector supplying the constant current, said circuit further comprising a temperature stable reference means having a regulated voltage point coupled to the base of said transistors and to a temperature compensating diode which is coupled in a parallel path with the path of the base-emitter junctions of the constant current source transistors, said diode and said junctions having approximately equal temperature coefficients so that any change in voltage across said junctions as a function of ambient temperature is compensated by a similar change in voltage across said diode for stabilizing said constant current.

8. An AM-FM detector circuit as in claim 7 wherein said bias current path comprises an isolating transistor having its first output electrode coupled to the input electrodes of said fifth and sixth transistors, its second output electrode coupled to ground and its input electrode coupled to the second output electrode of said fifth transistor whereby current in said sixth transistor is substantially isolated from the current outputs of said second and fourth transistors.

9. An AM-FM detector circuit as in claim 8 that is constructed as an integrated circuit wherein said emitter follower transistors and first, second, third and fourth transistors are NPN transistors of minimum junction geometry, said fifth transistor is a PNP transistor of minimum junction geometry and said sixth transistor is a PNP transistor having a junction geometry two times said minimum junction geometry.

10. An AM-FM detector circuit as in claim 9 wherein said bias current means comprises a NPN bias transistor having a junction geometry two times said minimum junction geometry for providing approximately two times the current of said emitter follower transistors for a given junction voltage drop, having its first output electrode coupled to the input electrode of said fourth transistor, its second output electrode coupled to the second output electrode of said third transistor and its input electrode adapted to be coupled to said bias voltage means.

* * * * *